US011854803B2

United States Patent
Chan et al.

(10) Patent No.: US 11,854,803 B2
(45) Date of Patent: Dec. 26, 2023

(54) GATE SPACER PATTERNING

(71) Applicant: IMEC VZW, Leuven (BE)

(72) Inventors: Boon Teik Chan, Wilsele (BE); Pierre Morin, Woluwe-Saint-Pierre (BE); Antony Premkumar Peter, Heverlee (BE)

(73) Assignee: IMEC VZW, Leuven (BE)

( * ) Notice: Subject to any disclaimer, the term of this patent is extended or adjusted under 35 U.S.C. 154(b) by 166 days.

(21) Appl. No.: 17/371,936

(22) Filed: Jul. 9, 2021

(65) Prior Publication Data

US 2022/0084822 A1 Mar. 17, 2022

(30) Foreign Application Priority Data

Sep. 15, 2020 (EP) ..................................... 20196264

(51) Int. Cl.
*H01L 21/02* (2006.01)
*H01L 21/321* (2006.01)
*H01L 21/8234* (2006.01)
*H01L 29/66* (2006.01)

(52) U.S. Cl.
CPC .... *H01L 21/02636* (2013.01); *H01L 21/0228* (2013.01); *H01L 21/02274* (2013.01); *H01L 21/02282* (2013.01); *H01L 21/3212* (2013.01); *H01L 21/823431* (2013.01); *H01L 29/6681* (2013.01)

(58) Field of Classification Search
CPC ............. H01L 29/6653; H01L 29/6681; H01L 21/823468; H01L 21/02636; H01L 21/0228; H01L 21/3212; H01L 21/823431; H01L 21/02282; H01L 21/02274; H10B 12/36
See application file for complete search history.

(56) References Cited

U.S. PATENT DOCUMENTS

| 8,980,701 B1* | 3/2015 | Lu ..................... H01L 21/31116 |
| | | 438/303 |
| 9,899,515 B1* | 2/2018 | Cheng ............. H01L 21/823828 |
| 9,947,804 B1 | 4/2018 | Frougier et al. |
| 10,418,272 B1* | 9/2019 | Shu .................. H01L 21/823821 |
| 10,504,794 B1* | 12/2019 | Lee ..................... H01L 29/0847 |

(Continued)

FOREIGN PATENT DOCUMENTS

| EP | 3570317 A1 | 11/2019 |
| WO | 2013154842 A1 | 10/2013 |

OTHER PUBLICATIONS

Extended European Search Report and Written Opinion, Application No. EP20196264.4, dated Feb. 18, 2021, 7 pages.

*Primary Examiner* — Farun Lu
*Assistant Examiner* — Sandra Milena Rodriguez Villanu
(74) *Attorney, Agent, or Firm* — McDonnell Boehnen Hulbert & Berghoff LLP

(57) ABSTRACT

A method for protecting a gate spacer when forming a FinFET structure, the method comprising: providing a fin with at least one dummy gate crossing the fin wherein a gate hardmask is present on top of the dummy gate; providing a gate spacer such that it is covering the dummy gate and the gate hardmask; recessing the gate spacer such that at least a part of the gate hardmask is exposed; selectively growing, by means of area selective deposition, extra capping material over the exposed part of the gate hardmask.

18 Claims, 7 Drawing Sheets

(56) References Cited

U.S. PATENT DOCUMENTS

| | | |
|---|---|---|
| 10,600,885 B2 | 3/2020 | Cheng et al. |
| 10,629,707 B2 | 4/2020 | Zang et al. |
| 11,600,713 B2* | 3/2023 | Liao .................... H01L 29/785 |
| 2014/0110755 A1* | 4/2014 | Colinge ............. H01L 29/0847 |
| | | 257/E21.409 |
| 2018/0144994 A1 | 5/2018 | Song |
| 2019/0371674 A1* | 12/2019 | Wu .................. H01L 29/66545 |

* cited by examiner

GATE SPACER PATTERNING

CROSS-REFERENCE TO RELATED APPLICATIONS

The present application is a non-provisional patent application claiming priority to European Patent Application No. 20196264.4, filed Sep. 15, 2020, the contents of which are hereby incorporated by reference.

FIELD OF THE DISCLOSURE

The application relates to the field of gate spacer patterning. More specifically, this application relates to a method of protecting a gate spacer when forming a fin field-effect transistor (FinFET) structure.

BACKGROUND

In the context of FinFET devices, for example, complementary FET (CFET) FinFET devices, gate spacer patterning with tall fin heights (e.g., >50 nm) becomes a challenging process. This is, in particular, a problem when recessing the gate spacer down to the bottom of the fin. Further, increasing the fin height requires increasing the amount by which the gate spacer needs to be recessed to the bottom. Especially when the fin height is 50 nm or more, this increases the risk of dummy gate exposure (e.g., poly-silicon) after recessing the gate spacer. When the recess step is followed by an epitaxial growth step, this will lead to parasitic epitaxial growth on the exposed dummy gate, which has a detrimental impact on the further processing steps.

The gate spacer may, for example, be a low-k SiCO spacer, the dummy gate may, for example, be a poly-silicon gate, and the CFET fin height may, for example, be 90 nm. In this case, a loss of SiCO spacer is expected during spacer over-etching, which might result in exposure of the dummy poly-silicon gate.

SUMMARY

Embodiments disclosed herein provide a suitable method for protecting a gate spacer in the process of forming a FinFET structure. In particular, the embodiments disclosed herein relate to a method for protecting a gate spacer when forming a FinFET structure.

The method comprises:
providing a fin with at least one dummy gate crossing the fin wherein a gate hardmask is present on top of the dummy gate,
providing a gate spacer such that it is covering the dummy gate and the gate hardmask,
recessing the gate spacer such that at least a part of the gate hardmask is exposed, and
selectively growing, by means of area selective deposition, extra capping material over the exposed part of the gate hardmask.

These embodiments facilitate a reduction in integration complexity. The reasons, therefore, being that the extra capping material is deposited by area selective deposition, and that by providing the extra capping material over the gate hardmask the gate spacer is protected during spacer over-etch in a later stage in the process. Since the extra capping material is grown over the gate hardmask, the capping material protects the gate spacer during spacer over-etching, as the spacer over-etching is directional. By selectively growing the extra capping material by means of area selective deposition, growing of the extra capping material on the gate spacer can be avoided.

Particular aspects are set out in the accompanying independent and dependent claims. Features from the dependent claims may be combined with features of the independent claims and with features of other dependent claims as appropriate and not merely as explicitly set out in the claims.

These and other aspects will be apparent from and elucidated with reference to the embodiment(s) described hereinafter.

BRIEF DESCRIPTION OF THE FIGURES

The above, as well as additional features, will be better understood through the following illustrative and non-limiting detailed description of example embodiments, with reference to the appended drawings.

Figure 1:
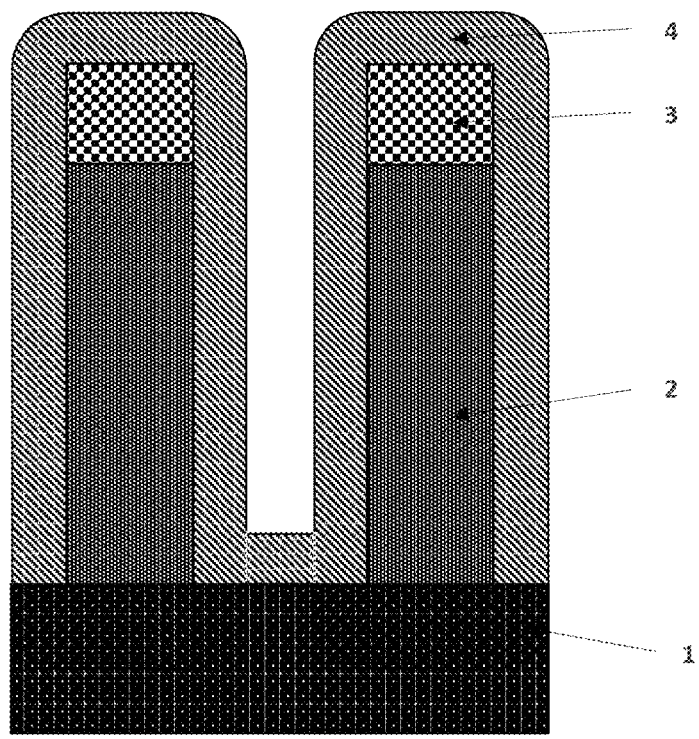
FIG. 1 shows an intermediate stack of a fin after gate spacer deposition obtained after a forming method, in accordance with example embodiments.

Any reference signs in the claims shall not be construed as limiting the scope. In the different drawings, the same reference signs refer to the same or analogous elements. All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings.

That which is encompassed by the claims may, however, be embodied in many different forms and should not be construed as limited to the embodiments set forth herein; rather, these embodiments are provided by way of example. Furthermore, like numbers refer to the same or similar elements or components throughout.

The terms first, second, and the like in the description and in the claims are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, particular features, structures or characteristics may be combined in any suitable manner, as would be apparent to one of ordinary skill in the art from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed aspects require more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some, but not other features included in other embodiments, combinations of features of different embodiments are meant to be within the scope of the claims, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures, and techniques have not been shown in detail in order not to obscure an understanding of this description.

Figure 13:
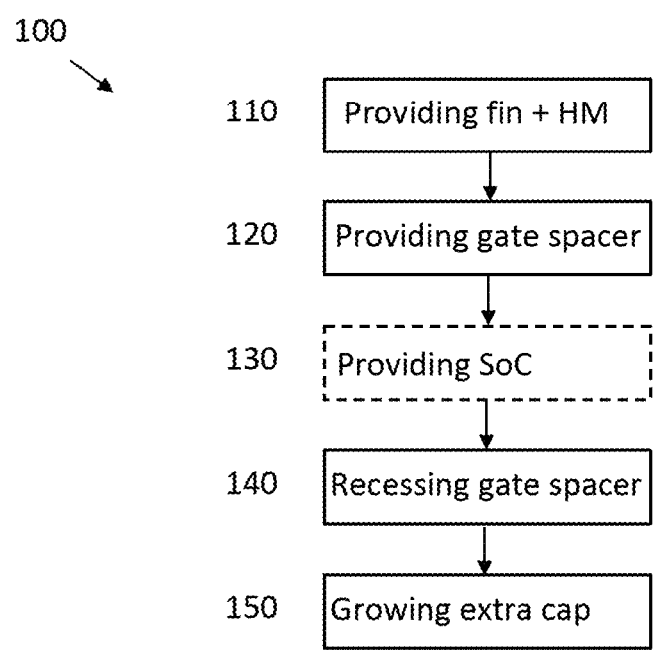
FIG. 13 shows a flowchart of an exemplary forming method, in accordance with example embodiments.

Embodiments disclosed herein relate to a method 100 for protecting a gate spacer when forming a FinFET structure. An example of a flow chart of such a method is shown in FIG. 13.

Intermediate stacks obtained when applying these method steps are schematically illustrated in FIG. 1 to FIG. 10.

A method in accordance with embodiments comprises the following steps:

providing 110 a fin 1 with at least one dummy gate 2 crossing the fin 1, wherein a gate hardmask 3 is present on top of the dummy gate 2;

providing 120 a gate spacer 4 such that gate spacer 4 covers the dummy gate 2 and the gate hardmask 3;

recessing 140 the gate spacer 4 such that at least a part of the gate hardmask 3 is exposed;

selectively growing 150, via area selective deposition, extra capping material 5 over the exposed part of the gate hardmask 3.

Where in embodiments reference is made to selectively growing of extra capping material, the growing is such that the capping material grows on the gate hardmask 3 and not on the gate spacer 4.

By applying such a method, a mushroom gate cap, which comprises the gate hardmask 3 and the extra capping material 5, is obtained, and the mushroom gate cap covers the gate spacer. The gate hardmask material and the extra capping material should have good etch selectivity to the gate spacer. The mushroom gate cap serves as a protection layer for the gate spacer beneath the sidewalls during the spacer etch. By providing such a mushroom gate cap, some of the patterning challenges can be reduced.

The embodiments facilitate a reduction in integration complexity. The reasons, therefore, being that the extra capping material is deposited by area selective deposition, and that by providing the extra capping material over the gate hardmask, the gate spacer is protected during spacer over-etch in a later stage in the process. Since the extra capping material is grown over the gate hardmask, the extra capping material protects the gate spacer during spacer over-etching as the spacer over-etching is directional.

By selectively growing the extra capping material via area selective deposition, the growing of the extra capping material on the gate spacer can be avoided.

In embodiments, a low-k gate spacer is provided. The dielectric constant may, for example, be below 5, or even below 4.7, or even 4.5, or smaller.

In an example embodiment, the spacer is a SiCO spacer.

In embodiments, the extra capping material comprises $Si_3N_4$, which is deposited by area selective deposition on the gate hardmask, which comprises $Si_3N_4$, while it is not deposited on other dielectric material such as SiCO or $SiO_2$. As a result, $Si_3N_4$ is protecting the SiCO spacer at the sidewalls and extends the over-etching of the spacer on the fin without consuming the SiCO on the gate sidewall.

The dummy gate 2 may comprise amorphous silicon or poly-silicon and should not be exposed. As explained before, however, the dummy gate may be exposed when over-etching the spacer. When exposed, in a next step, during epitaxial growth, the epi will grow on the exposed silicon of the dummy gate. This parasitic epi growth will be problematic in later stages in the process and, hence, should be avoided.

In general, providing the capping facilitates protecting the gate spacer during spacer over-etch. The reason, therefore, being that the etching is directional, and hence the extra capping material protects the gate spacer.

In embodiments, recessing 140 the gate spacer may, for example, be done by exposing the gate spacer to $Cl_2/CH_2F_2$ gas mixtures for a SiCO gate spacer etch. The amount of recess can be controlled by the etch time.

In some embodiments, recessing the gate spacer is done such that the dummy gate remains covered by the gate spacer. This is, however, not strictly necessary.

In other embodiments, recessing may be done such that the recessed gate spacer has a final level that is lower than the interface between the gate hard mask 3 and the dummy gate 2. In this case, before doing the area selective deposition, a clean step is, in an example, introduced to clean the native oxide that may be present on the now exposed sides of the dummy gate.

The depth of recess that can be provided technically in a feasible way ending below the interface between the gate hard mask 3 and the dummy gate 2 can be as much as the thickness of the extra capping material that will be deposited when selectively growing the extra capping material. The final level may, for example, be 3 nm, or even 10 nm lower than the interface between the gate hardmask and the dummy gate. The gate spacer should not be recessed to the extent that, even after selective deposition of the extra capping material, part of the dummy gate is exposed. Otherwise, this could lead to parasitic epi growth during the epitaxy process (e.g., CMOS epitaxy process). The gate spacer etch may be time controlled for controlling the depth of the recess.

In embodiments, the gate spacer may be recessed up to a level that is substantially the same as the interface between the gate hardmask and the dummy gate.

Two examples of integration schemes are proposed. Both start after the low-k deposition. The second integration scheme has optional steps which are done to minimize the loss on the shallow trench isolation (STI).

In both integration schemes, the gate spacer (e.g., SiCO) is exposed to free the gate hardmask (e.g., silicon nitride). The extra capping material (e.g., silicon nitride) only grows on the silicon nitride and eventually, a mushroom cap can be obtained.

In embodiments, the extra capping material 5 is selectively grown such that it has a thickness between 3 and 10 nm.

It was found that the optimal growth of the $Si_3N_4$ extra capping material is obtained when its thickness is between 3 nm and 10 nm. Growing above this thickness results in extra capping material, which can start to grow on the gate spacer. This, in turn, results in loss of the selectivity window. In an example embodiment, the thickness is between 3 nm and 7 nm. In another example embodiment, the thickness is between 6 nm and 7 nm.

The thickness may, thereby, be selected such that the gate spacer thickness is covered by the extra capping material. The eventual thickness of the extra capping material may be substantially the same as a thickness of the gate spacer 4. The extra capping material may be deposited using atomic layer deposition (ALD), and the thickness of the deposited layer of extra capping material may be controlled by controlling the number of ALD cycles. The more ALD cycles that are performed, the thicker the film gets.

The thickness of the deposited layer of extra capping material may be selected such that it is substantially the same as the thickness of the gate spacer, and such that the deposited layer of extra capping material is covering the gate spacer.

In embodiments, the gate spacer is a low-k material. In the previous example, this was silicon carbon oxide. However, other low-k materials such as silicon carbon nitride may also be used. In embodiments, the hardmask may be $SiO_2$.

In embodiments, the provided fin has a height of at least 50 nm.

A method according to embodiments facilitates the use of fins having a height of more than 50 nm. For instance, in general, the amount of the gate spacer that needs to be recessed to the bottom increases with the height of the fin. Providing the extra capping material via area selective deposition on top of the exposed gate hardmask helps prevent the gate spacer from becoming recessed to the extent that the dummy gate gets exposed. Also, after the recess step, the silicon is epitaxially grown. Therefore, exposure of the dummy gate could result in parasitic EPI growth on the exposed dummy gate. Thus, the embodiments facilitate the use of fins having a height of 50 nm or more while avoiding exposure of the dummy gate after over-etching.

In example embodiments, the fin has a height up to 100 nm.

A method in accordance with embodiments may be applied on advanced logic patterning logic devices, which require spacer etch on fins with a height of 50 nm. They may be used in FinFET technology (e.g., to build CFETs). Typical fins have a height in the range of 50 nm. For CFETs, this height may even extend up to 100 nm. In this case, the gate spacer needs to be recessed. This could be solved by thickening the gate hard mask, but in that case, the aspect ratio would become too high. The embodiments herein facilitate providing extra gate capping material over the gate hardmask, which protects the gate spacer during spacer over-etch without making the aspect ratio too high.

In embodiments, the gate hardmask may, for example, be a stack of $SiO_2/Si_3N_4$. However, other compounds can be used.

The gate hardmask may, for example, have a thickness between 30 nm and 150 nm. Particular examples of the thickness are greater than 40 nm, greater than 60 nm, and even greater than 70 nm. In one example embodiment, the thickness is around 65 nm. In another example embodiment, the thickness is between 50 and 80 nm.

In the first integration technique, the standard spacer etch is applied down to a level, such that the gate hardmask (e.g., silicon nitride) is exposed. Afterward, the extra capping material is grown. As long as a small amount of gate hardmask is exposed, it is possible to grow the extra capping material. It is, for example, possible to stop the etch-back in the middle of the gate hardmask.

In the second integration scheme, the loss in the STI can be minimized by applying a spin-on carbon (SoC) coating step, followed by a SoC etching step and a low-temperature SiO2 deposition and chemical mechanical polishing (CMP) step. By using the second technique, the loss of gate spacer at the bottom is avoided. Such a method, according to the second integration technique, may comprise the following additional steps compared to the first integration technique.

providing 131 a spin-on carbon coating 6 over the gate spacer 4;
    etching back 132 the spin-on carbon coating below a top of the gate hardmask 3;
    depositing 133 a silicon oxide film 7, over the gate spacer 4 and the carbon coating 6,
        wherein recessing 140 the gate spacer comprises polishing the silicon oxide film 7, followed by an etch-back of the silicon oxide film 7 and the gate spacer 4 such that at least a part of the gate hardmask 3 is exposed and such that the dummy gate 2 remains covered by the gate spacer 4; and stripping 145 the spin-on carbon coating 6 before or after selectively growing 150 the extra capping material 5.

The loss of gate spacer can be reduced by providing a spin-on carbon coating over the gate spacer before recessing the gate spacer.

The spin-on carbon coating is, in an example, performed prior to selectively growing the extra capping material due to temperature constraints.

Depositing 133 of the silicon oxide film 7 may be done by plasma-enhanced atomic layer deposition.

In embodiments, the silicon oxide film 7 is deposited 133 such that it is a $SiO_2$ film.

In embodiments, polishing the silicon oxide film 7 is done by chemical mechanical polishing or dry etch-back, selective to the gate hardmask 3.

In embodiments, stripping the SoC coating may, for example, be done with a microwave stripper with $O_2$ plasma-based or $N_2/H_2$ based to prevent oxidation on the SiN gate hardmask. Oxidation on the SiN gate hardmask should be prevented to facilitate the selective SiN growth with the ASD method.

In the following paragraphs, the figures will be discussed in more detail.

Figure 2:
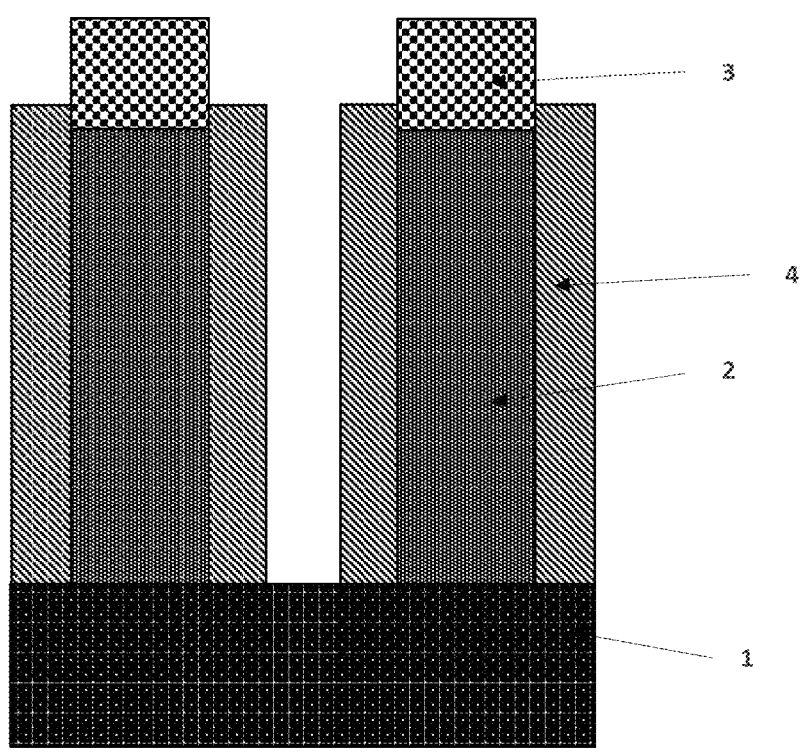
FIG. 2 shows an intermediate stack of a fin after partial spacer etch, in accordance with example embodiments.
Figure 3:
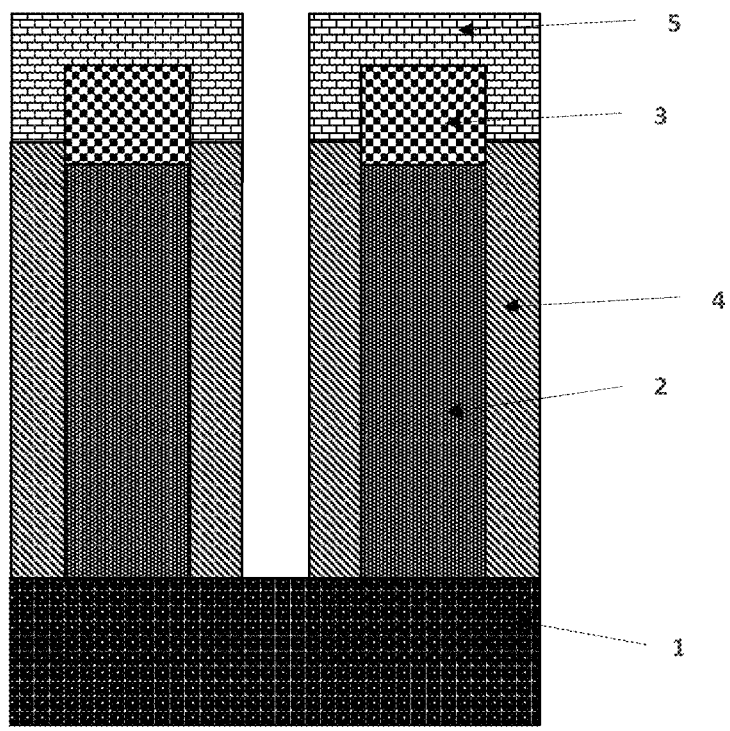
FIG. 3 shows an intermediate stack of a fin after selectively growing extra capping material over the exposed part of the gate hardmask, in accordance with example embodiments.

FIGS. 1 to 3 illustrate intermediate stacks obtained using an example method according to embodiments corresponding with the first integration technique.

FIG. 1 shows an intermediate stack of a fin after providing 120 a gate spacer by gate spacer deposition. In this figure, a fin 1 is shown. This fin is formed on a substrate (not shown), which may be a silicon substrate. The dummy gate 2 in this example may be a poly-silicon or amorphous silicon substrate. The gate hardmask 3 may, for example, be a $Si_3N_4$ hardmask. The gate spacer 4 is made of a low-k material, for example, SiCO.

FIG. 2 shows an intermediate stack of a fin after recessing 140 the gate spacer by partial spacer etch, such that a part of the gate hardmask 3 is exposed and such that the dummy gate 2 remains covered by the gate spacer 4, in accordance with embodiments.

FIG. 3 shows an intermediate stack of a fin after selectively growing 150, via area selective deposition, extra capping material over the exposed part of the gate hardmask, in accordance with embodiments. In this example, the extra capping material may be $Si_3N_4$, and the gate hardmask may be $Si_3N_4$.

Figure 4:
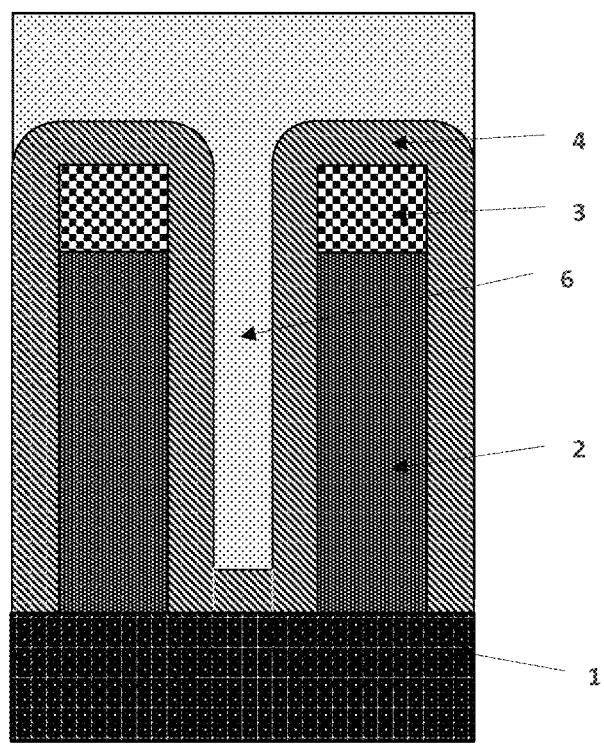
FIG. 4 shows an intermediate stack of a fin after spin-on carbon (SoC) coating, in accordance with embodiments.

FIG. 4 shows an intermediate stack of a fin after providing 130 a spin-on carbon (SoC) coating, in accordance with embodiments corresponding with the second integration technique. The SoC is indicated by reference number 6.

Figure 5:
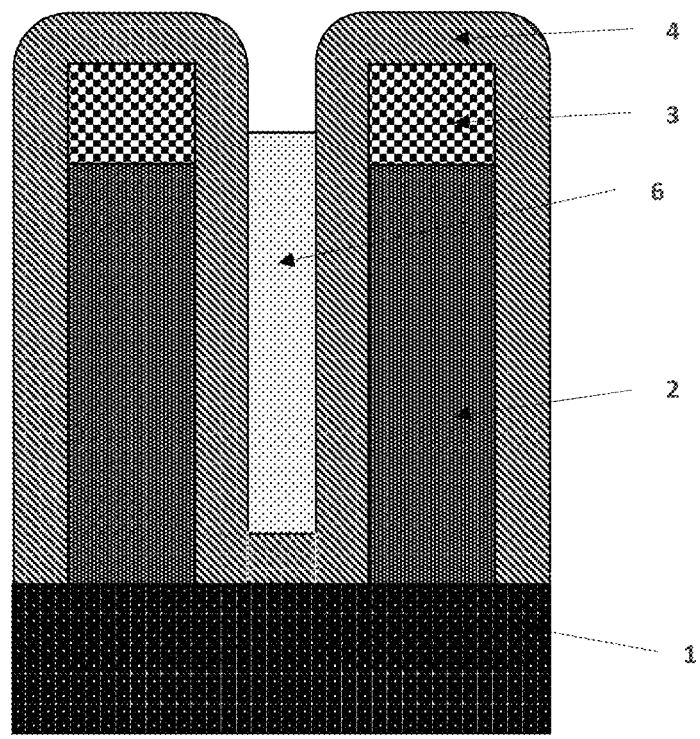
FIG. 5 shows an intermediate stack of a fin after SoC etch-back, in accordance with example embodiments.

FIG. 5 shows an intermediate stack of a fin after SoC etch-back, in accordance with embodiments corresponding with the second integration technique. The SoC coating 6 is etched back below a top of the hardmask 3.

Figure 6:
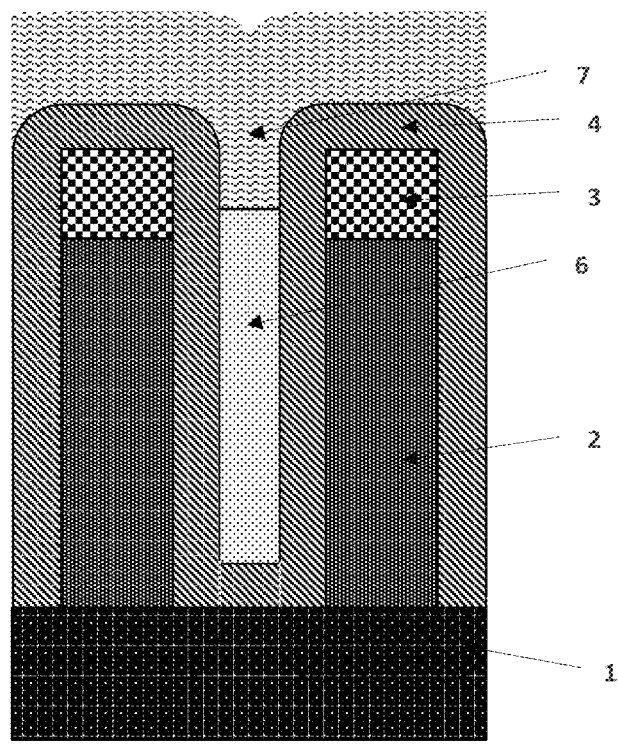
FIG. 6 shows an intermediate stack obtained after depositing a silicon oxide film, in accordance with example embodiments.

FIG. 6 shows an intermediate stack obtained after depositing a silicon oxide film 7 over the gate spacer 4 and the carbon coating 6. Depositing the silicon oxide film may be achieved by plasma-enhanced atomic layer deposition of $SiO_2$ (PEALD $SiO_2$ deposition).

Figure 7:
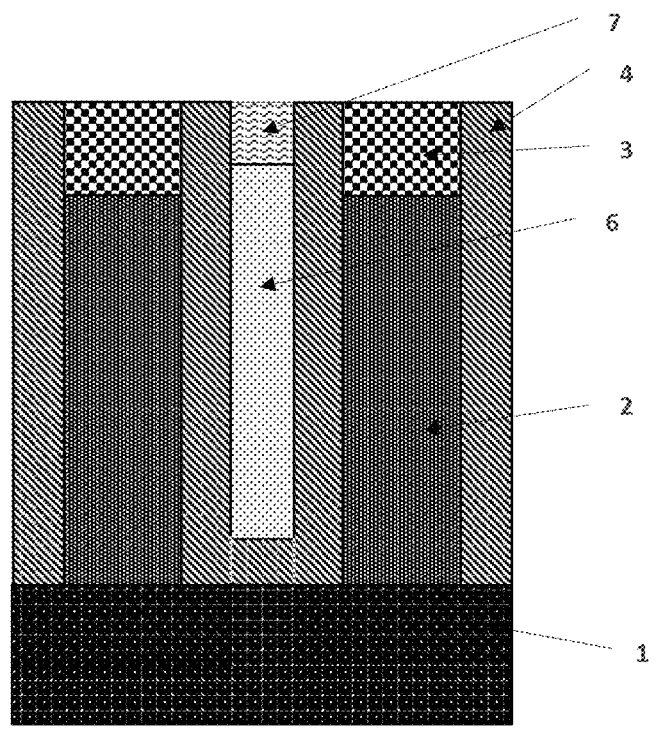
FIG. 7 shows an intermediate stack obtained after recessing the silicon oxide film, in accordance with example embodiments.

FIG. 7 shows an intermediate stack obtained after recessing 140 the silicon oxide film and the gate spacer 4. This may be achieved by etch-back. The etch-back may be done by chemical mechanical polishing (CMP).

Figure 8:
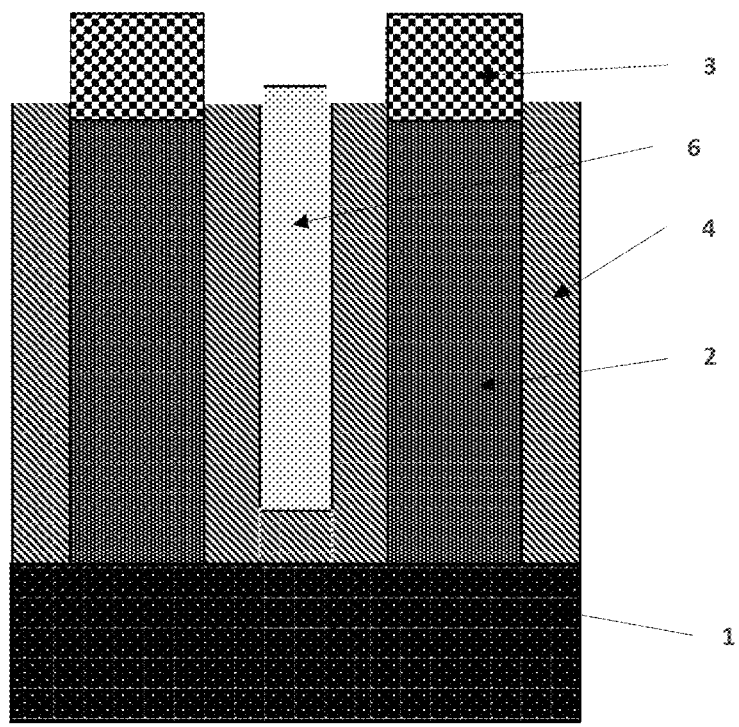
FIG. 8 shows an intermediate stack obtained after recessing the silicon oxide film and the gate spacer, in accordance with example embodiments.

FIG. 8 shows an intermediate stack obtained after further etch-back of the silicon oxide film and the gate spacer such that the sidewalls of the gate hardmask are exposed.

Figure 9:
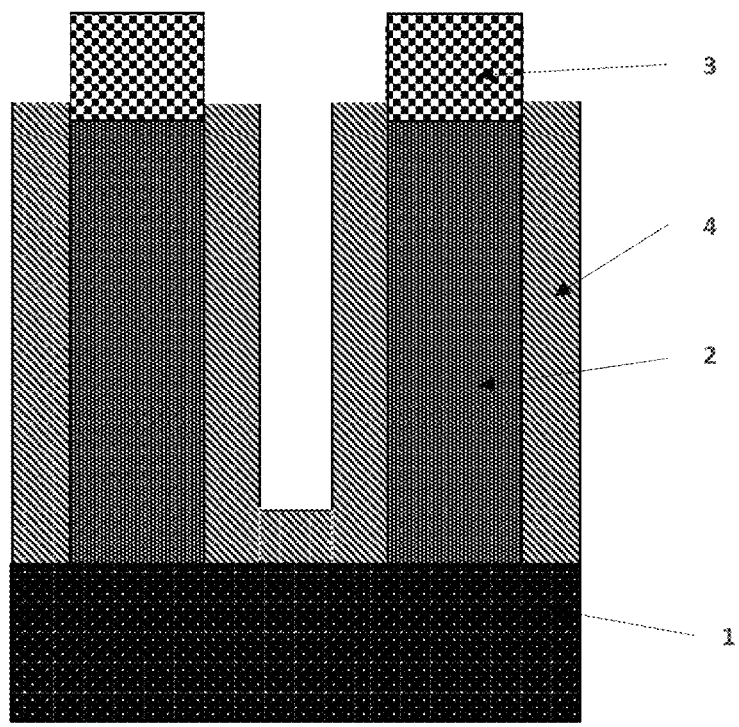
FIG. 9 shows an intermediate stack obtained after stripping of the spin-on carbon coating, in accordance with example embodiments.

FIG. 9 shows an intermediate stack obtained after stripping 145 of the spin-on carbon coating 6.

Figure 10:
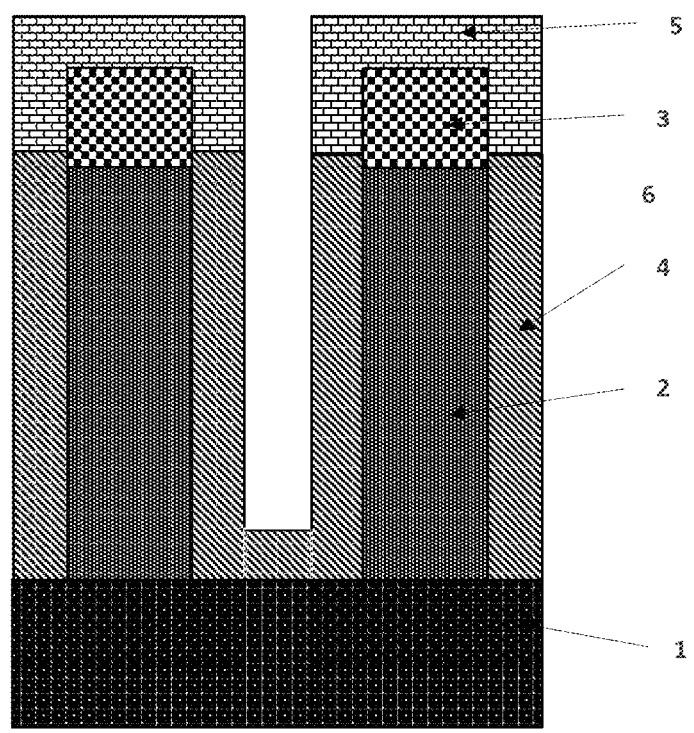
FIG. 10 shows an intermediate stack obtained after selectively growing extra capping material over the exposed part of the gate hardmask, in accordance with example embodiments.

FIG. 10 shows an intermediate stack obtained after selectively growing 150, via area selective deposition, extra capping material 5 over the exposed part of the gate hardmask 3 (e.g., ASD $Si_3N_4$ on $Si_3N_4$ gate HM).

Figure 11:
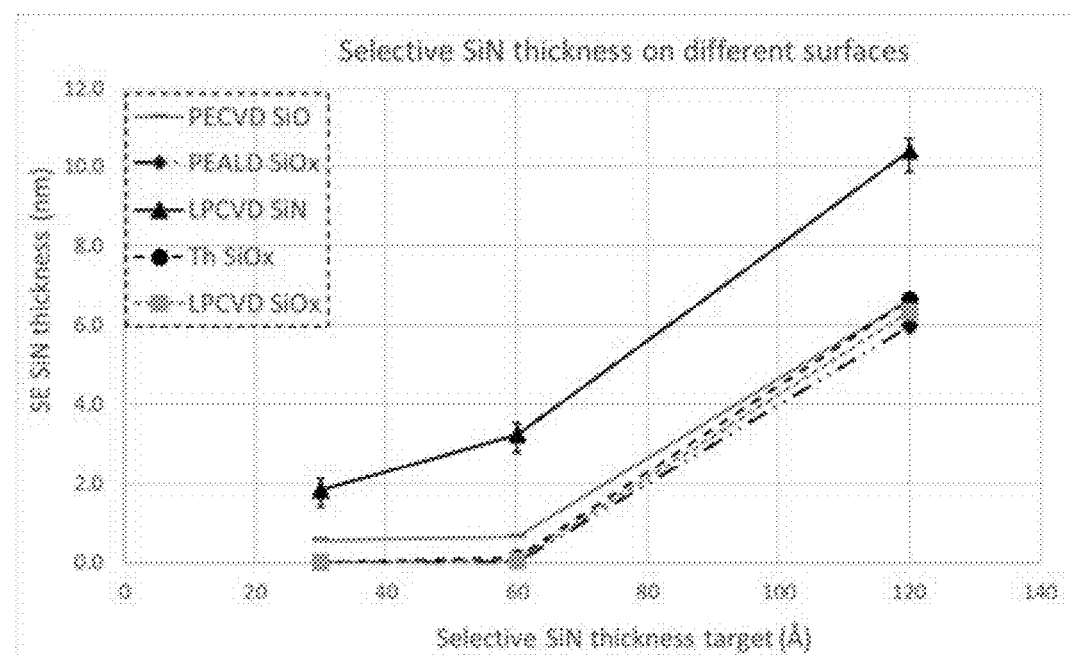
FIG. 11 shows a graph illustrating the selective SiN thickness on different surfaces experimentally obtained, in accordance with example embodiments.

FIG. 11 shows the selective SiN thickness as a function of the thickness target. The flat regions show the selectivity window. In the selectivity window, the SiN steadily grows on the SiN, while on the oxide surfaces, no growth is illustrated. The thickness of the eventual capping material may be chosen such that the growth on the nitride is significant and only a limited growth is present on the oxide surface.

Figure 12:
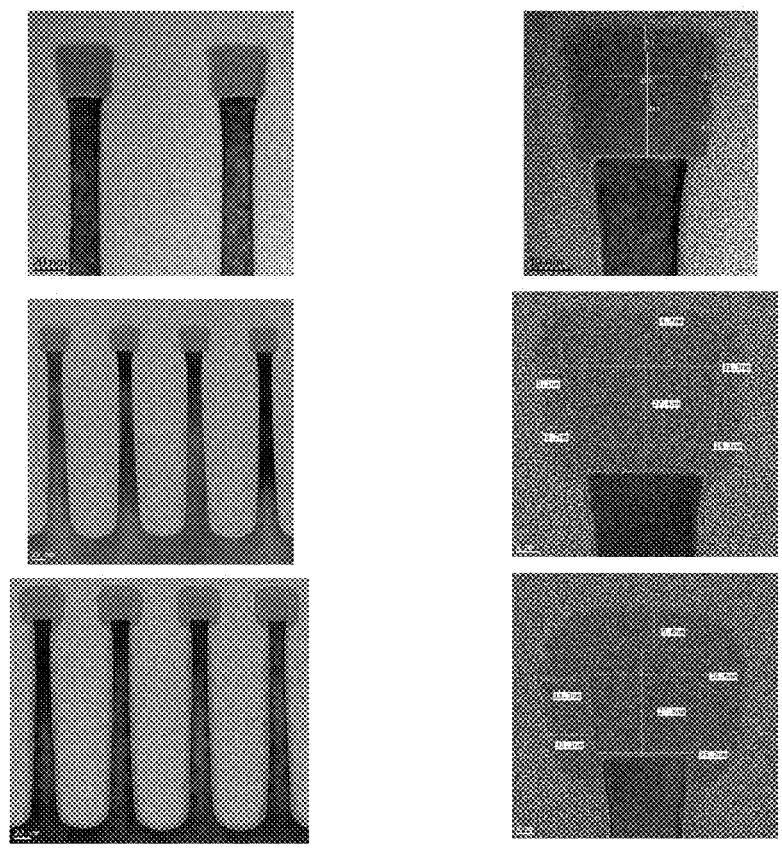
FIG. 12 shows TEM images of a fin comprising a mushroom gate cap for experimentally illustrating the feasibility and limits of a forming method, in accordance with example embodiments.

FIG. 12 shows transmission electron microscopy (TEM) images on 200 nm after ASD of SiN on 90 nm pitch high aspect ratio Si lines with SiN hardmask. The top drawings show 6 nm films obtained using a 515° C. selective SiN process. The middle drawings show 7 nm films obtained using a 450° C. selective SiN process. The bottom drawings show 12 nm films obtained using a 150° C. selective SiN process. The left column shows the dummy gates and mushroom caps. The right columns show a close-up of the mushroom caps. In both the top and middle drawings, a clean morphology is obtained at the sidewalls. The best selectivity is obtained up to 5 nm films. For these films, no growth is present on the Si sidewalls. However, other film thicknesses are possible. In this example, a clear selectivity loss is present when the thickness of the extra capping material is increased to 12 nm. In this case, the silicon nitride is also growing on the silicon surface. This results in a discontinuous/rough, thin layer on the silicon.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for protecting a gate spacer when forming a FinFET structure, the method comprising:
   providing a fin with at least one dummy gate crossing the fin wherein a gate hardmask is present on top of the dummy gate;
   covering the dummy gate and the gate hardmask with a gate spacer;
   selectively growing, via area selective deposition, extra capping material over an exposed part of the gate hardmask, wherein selectively growing includes:
   providing a spin-on carbon coating over the gate spacer;
   etching back the spin-on carbon coating below a top of the gate hardmask;
   depositing a silicon oxide film over the gate spacer and the spin-on carbon coating,
   wherein recessing the gate spacer comprises polishing the silicon oxide film, followed by an etch-back of the silicon oxide film and the gate spacer so that at least a part of the gate hardmask is exposed and so that the dummy gate remains covered by the gate spacer; and stripping the spin-on carbon coating before or after selectively growing the extra capping material.

2. The method according to claim 1, wherein recessing the gate spacer comprises recessing the gate spacer to a final level which is not lower than a thickness of the extra capping material below an interface between the gate hardmask and the dummy gate.

3. The method according to claim 2, wherein the fin has a height of at least 50 nm.

4. The method according to claim 3, wherein the gate spacer comprises SiCO.

5. The method according to claim 4, wherein the dummy gate comprises poly silicon or amorphous silicon.

6. The method according to claim 1, wherein the gate hardmask comprises $Si_3N_4$.

7. The method according to claim 6, wherein the extra capping material comprises $Si_3N_4$.

8. The method according to claim 7, wherein the extra capping material is selectively grown to have a thickness between 3 nm and 10 nm.

9. The method according to claim 1, wherein depositing the silicon oxide film is done by plasma-enhanced atomic layer deposition.

10. The method according to claim 9, wherein the silicon oxide film is deposited so that it is a $SiO_2$ film.

11. The method according to claim 10, wherein polishing the silicon oxide film is done by chemical mechanical polishing, or dry etch-back, selective to the gate hardmask.

12. The method according to claim 1, wherein the silicon oxide film is deposited so that it is a $SiO_2$ film.

13. The method according to claim 1, wherein polishing the silicon oxide film is done by chemical mechanical polishing, or dry etch-back, selective to the gate hardmask.

14. The method according to claim 1, wherein the selective growing of the extra capping material is done such that an eventual thickness of the extra capping material is substantially the same as a thickness of the gate spacer.

15. The method according to claim 1, wherein the selective growing of the extra capping material is done such that an eventual thickness of the extra capping material is substantially the same as a thickness of the gate spacer.

16. The method according to claim 1, wherein the fin has a height of at least 50 nm.

17. The method according to claim 1, wherein the gate spacer comprises SiCO.

18. The method according to claim 1, wherein the dummy gate comprises poly silicon or amorphous silicon.

\* \* \* \* \*